(12) United States Patent
Cho

(10) Patent No.: US 7,808,321 B2
(45) Date of Patent: Oct. 5, 2010

(54) AMPLIFIER CIRCUIT

(75) Inventor: Ji-ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/265,023

(22) Filed: Nov. 5, 2008

(65) Prior Publication Data

US 2009/0289712 A1    Nov. 26, 2009

(30) Foreign Application Priority Data

May 20, 2008    (KR) .................. 10-2008-0046618

(51) Int. Cl.
   *H03F 3/45* (2006.01)
(52) U.S. Cl. ...................... 330/257; 330/253
(58) Field of Classification Search ................. 330/253, 330/257, 261
   See application file for complete search history.

(56) References Cited

U.S. PATENT DOCUMENTS 5,200,710 A *  4/1993  Kato ........................... 330/257
6,741,130 B2 *  5/2004  Wey et al. .................... 330/253
7,486,140 B2 *  2/2009  Matsuda et al. ............. 330/257
7,567,124 B2 *  7/2009  Lih ............................. 330/253

FOREIGN PATENT DOCUMENTS

| JP | 2001068990 | 3/2001 |
| KR | 1020060096695 | 9/2006 |
| KR | 2007166174 | 6/2007 |

* cited by examiner

*Primary Examiner*—Henry K Choe
(74) *Attorney, Agent, or Firm*—Volentine & Whitt, PLLC

(57) ABSTRACT

An amplifier circuit includes first and second transistor circuits, a current supply unit, and a current sink unit. The first transistor circuit is operatively responsive to a first input signal, and the second transistor circuit is operatively responsive to a second input signal. The current supply unit includes at least two symmetrically configured current mirrors connected to a source voltage, and provides a first current to the first transistor circuit and a second current to the second transistor circuit, where a magnitude of the first and second currents is the same. The current sink unit is responsive to an enable signal to sink the first and second currents supplied to the first and second transistor circuits to a ground voltage.

1 Claim, 2 Drawing Sheets

AMPLIFIER CIRCUIT

PRIORITY CLAIM

A claim of priority is made to Korean Patent Application No. 10-2008-0046618, filed May 20, 2008, in the Korean Intellectual Property Office, the disclosure of which is incorporated herein in its entirety by reference.

SUMMARY

The present invention generally relates to electronic circuits, and more particularly, the present invention relates to an amplifier circuit.

FIG. 1 is a circuit diagram of a conventional differential amplifier circuit 10 which may, for example, be utilized as a signal buffer in an integrated circuit.

Referring to FIG. 1, the differential amplifier circuit 10 includes a first NMOS transistor 11, a second NMOS transistor 12, a first PMOS transistor 13, a second PMOS transistor 14, and a third NMOS transistor 16. As shown, the gate of the first NMOS transistor receives a first input signal V1, and the gate of the second NMOS transistor 12 receives a second input signal V2. The source of the first PMOS transistor 13 receives a source voltage VDD, and the gate and drain of the first PMOS transistor 13 are commonly connected (at node N2) to the drain of the second NMOS transistor 12. The source of the second PMOS transistor 14 receives the source voltage VDD, the gate of the second PMOS transistor 14 is connected to the gate of the first PMOS transistor 13, and the drain of the second PMOS transistor 14 is connected (at node N1) to the drain of the first NMOS transistor 11. Finally, the drain of the third NMOS transistor 16 is commonly connected to sources of the first and second NMOS transistors 11 and 12, the gate of the third NMOS transistor 16 receives an enable signal EN, and the source of the third NMOS transistor 16 is connected to a ground voltage VSS.

Nodes N1 and N2 constitute output nodes of the differential amplifier circuit 10. Also, in the figure, reference numeral 15 denotes a current mirror formed by the first and second PMOS transistors 13 and 14.

An operation of the differential amplifier circuit 10 will now be described with reference to the voltage-timing diagram of FIG. 2.

In response to a logic high level of the enable signal EN, a voltage difference develops between nodes N1 and N2 in accordance with a voltage difference between the first and second input signals V1 and V2. That is, referring to FIG. 2, if the first input signal V1 has a higher voltage level than the second input signal V2 (V1>V2), the node N1 develops a voltage level which is lower than that of the node N2. In contrast, if the first input signal V1 has a lower voltage level than the second input signal V2 (V1<V2), the node N1 develops a voltage level which is higher than that of the node N2. In other words, the voltage level of the node N2 is remains constant, and the voltage level of node N1 varies in accordance with the voltage difference between the first and second input signals V1 and V2.

Ideally, the current mirror 15 functions to cause the same constant current (I1=I2) to flow through the nodes N1 and N2. However, a current mismatch (I1≠I2) can occur as the result of manufacturing related differences between gate-drain voltages and capacitances of the first and second PMOS transistors 13 and 14 of the current mirror 15. Current mismatch of the current mirror 15 causes a current distortion phenomenon in an initial operation of the differential amplifier circuit 10.

According to an aspect of the present invention, an amplifier circuit is provided which includes first and second transistor circuits, a current supply unit, and a current sink unit. The first transistor circuit is operatively responsive to a first input signal, and the second transistor circuit is operatively responsive to a second input signal. The current supply unit includes at least two symmetrically configured current mirrors connected to a source voltage, and provides a first current to the first transistor circuit and a second current to the second transistor circuit, where a magnitude of the first and second currents is the same. The current sink unit is responsive to an enable signal to sink the first and second currents supplied to the first and second transistor circuits to a ground voltage.

According to another aspect of the present invention, an amplifier circuit is provided which includes first through third metal oxide semiconductor (NMOS) transistors, and first through fourth p-channel metal oxide semiconductor (PMOS) transistors. The first NMOS transistor includes a gate connected to receive a first input signal, and the second NMOS transistor includes a gate connected to receive a second input signal. The first PMOS transistor includes a source connected to a source voltage, and a gate and a drain connected to a drain of the first NMOS transistor. The second PMOS transistor includes a source connected to the source voltage, and a drain connected to the drain of the first NMOS transistor. The third PMOS transistor includes a source connected to the source voltage, and a gate and a drain connected to a drain of the second NMOS transistor and to a gate of the second PMOS transistor. The fourth PMOS transistor includes a source connected to the source voltage, a gate connected to the gate of the first PMOS transistor, and a drain is connected to the drain of the second NMOS transistor. The third NMOS transistor includes a drain connected to sources of the first and second NMOS transistors, a gate is connected to receive an enable signal, and a source connected to a ground voltage.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF EMBODIMENTS

Non-limiting embodiments of the present invention are described below with reference to the accompanying drawings. The drawings are intended to illustrate exemplary embodiments of the present invention, but are not intended to limit the metes and bounds of the invention. Rather, the detailed description and drawings are presented in order to provide the reader with sufficient understanding of the present invention, the merits thereof, and the objectives accomplished by the implementation of the present invention.

Figure 1:
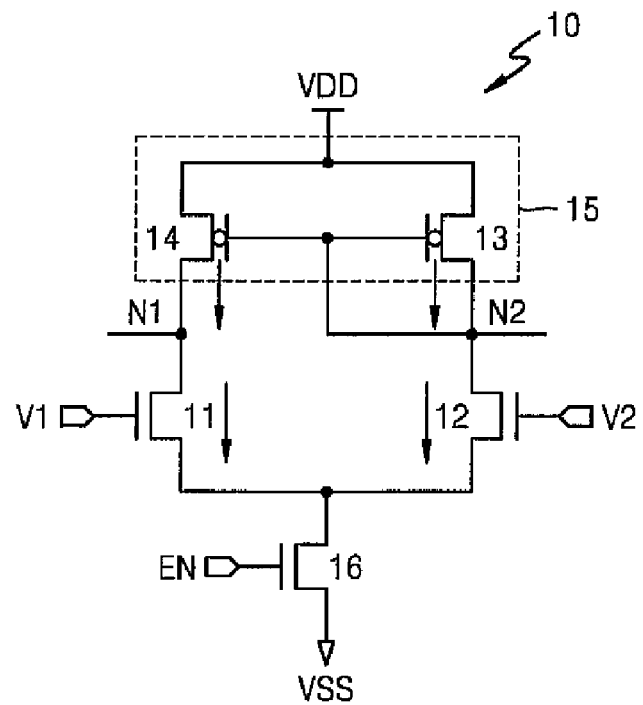
FIG. 1 is a circuit diagram of a conventional differential amplifier circuit.
Figure 2:
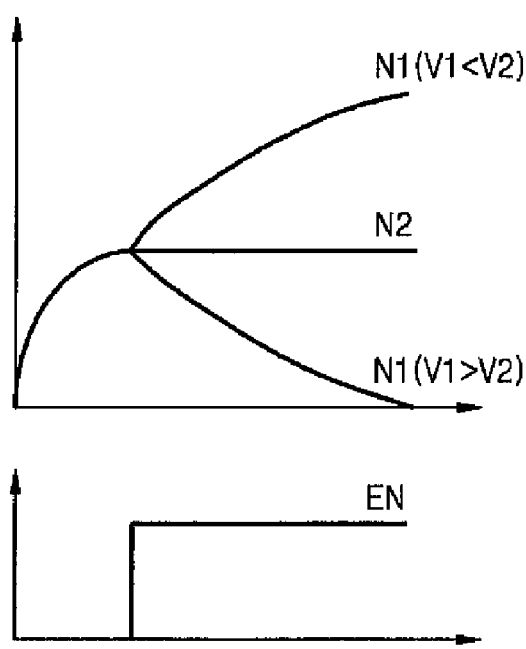
FIG. 2 is voltage-timing diagram of the conventional differential amplifier circuit illustrated in FIG. 1.
Figure 3:
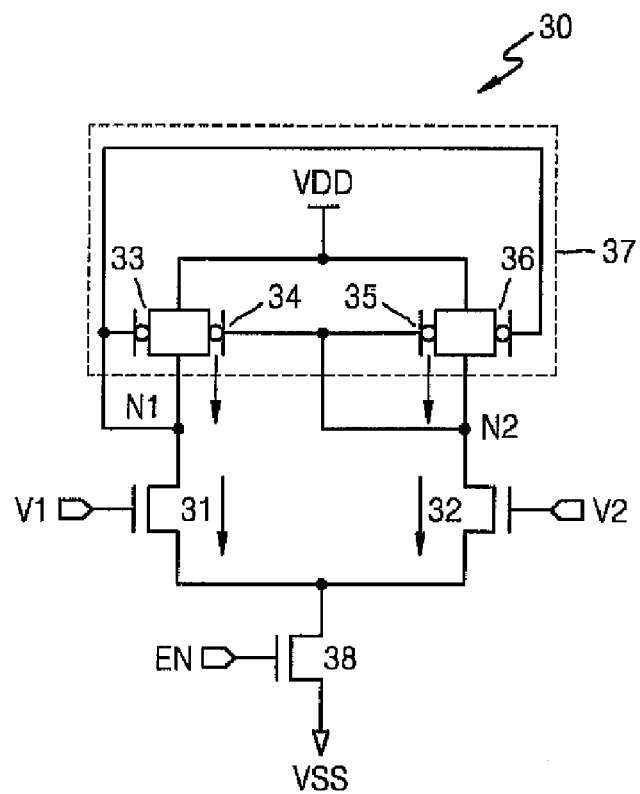
FIG. 3 is a circuit diagram of an amplifier circuit according to an embodiment of the present invention.

FIG. 3 is a circuit diagram of an amplifier circuit 30 according to an embodiment of the present invention.

Referring to FIG. 3, the amplifier circuit 30 of this example includes first through third n-channel metal oxide semiconductor (NMOS) transistors 31, 32, and 38, and first through fourth p-channel metal oxide semiconductor (PMOS) transistors 33, 34, 35, and 36. A gate of the first NMOS transistor 31 receives a first input signal V1, and a gate of the second NMOS transistor 32 receives a second input signal V2. The first and second input signals V1 and V2 may, for example, be complimentary input signals.

As shown in FIG. 3, a source of the first PMOS transistor 33 is connected to a source voltage VDD, and a gate and a drain of the first PMOS transistor 33 are commonly connected (at node N1) to a drain of the first NMOS transistor 31. A source of the second PMOS transistor 34 is connected to the source voltage VDD, and a drain of the second PMOS transistor 34 is connected to the drain of the first NMOS transistor 31. A source of the third PMOS transistor 35 is connected to the source voltage VDD, and a gate and a drain of the third PMOS transistor 35 are commonly connected (at node N2) to a drain of the second NMOS transistor 32 and to a gate of the second PMOS transistor 34. A source of the fourth PMOS transistor 36 is connected to the source voltage VDD, a gate of the fourth PMOS transistor 36 is connected to the gate of the first PMOS transistor 33, and a drain of the fourth PMOS transistor 36 is connected to the drain of the second NMOS transistor 32.

A drain of the third NMOS transistor 38 is commonly connected to sources of the first and second NMOS transistors 31 and 32, a gate of the third NMOS transistor 38 is connected to receive an enable signal EN, and a source of the third NMOS transistor 38 is connected to a ground voltage VSS.

As described above, the drain of the first NMOS transistor 31 and the drains of the first and second PMOS transistors 33 and 34 are connected to each other at a node N1, and the drain of the second NMOS transistor 32 and the drains of the third and fourth PMOS transistors 35 and 36 are connected to each other at a node N2. In the example of this embodiment, nodes N1 and N2 output complimentary output signals, respectively.

The first through fourth PMOS transistors 33, 34, 35, and 36 constitute an example of a current supply unit 37 containing at least two symmetrically configured current mirrors. That is, a first current mirror is defined by the first and fourth PMOS transistors 33 and 36, and a second current mirror is defined by the second and third PMOS transistors 34 and 35. The first and second current mirrors supply constant currents of the same magnitude through nodes N1 and N2 of the amplifier circuit 30.

Figure 4:
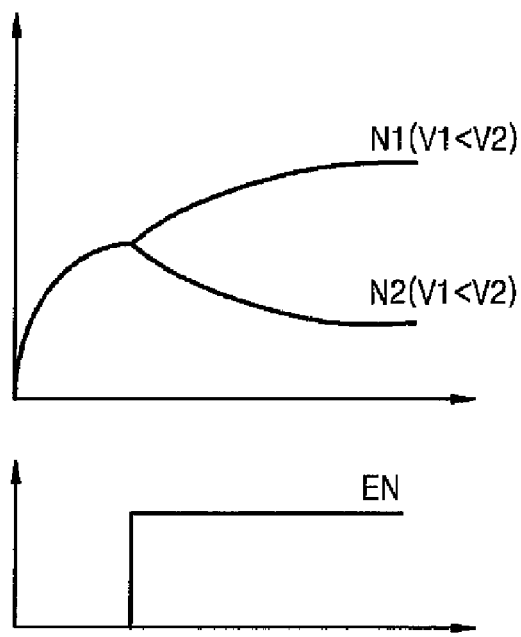
FIG. 4 is a voltage-timing diagram of the amplifier circuit illustrated in FIG. 3.

FIG. 4 is voltage-timing diagram for use in describing an operation of the amplifier circuit 30 illustrated in FIG. 3.

Referring to FIG. 4, in response to an enable signal EN that is activated to a logic high level, a voltage difference develops between output nodes N1 and N2 in accordance with a voltage difference between first and second input signals V1 and V2. That is, if voltage level of the first input signal V1 is lower voltage level than that of the second input signal V2 (V1<V2), the voltage level of the node N1 becomes about equal to the source voltage level, and the voltage level of the node N2 becomes about equal to the ground voltage level. Although not shown in FIG. 4, if voltage level of the first input signal V1 is higher than that of the second input signal V2 (V1>V2), the voltage level of the node N1 becomes about equal to the ground voltage level, and the voltage level of the node N2 becomes about equal to the source voltage level In more detail, the voltage levels of both of the nodes N1 and N2 vary due to a current difference between the nodes N1 and N2 through which the same amount of current flows, in accordance with the voltage difference between the first and second input signals V1 and V2. Accordingly, the amplifier circuit 30 has less offsets in an initial operation and thus a more accurate voltage difference may be identified. As a result, the amplifier circuit 30 exhibits high gain without current distortion.

While the inventive concept has been particularly shown and described with reference to exemplary embodiments thereof, it will be understood that various changes in form and details may be made therein without departing from the spirit and scope of the claims which follow.

What is claimed is:

1. An amplifier circuit comprising:
a first n-channel metal oxide semiconductor (NMOS) transistor which includes a gate connected to receive a first input signal;
a second NMOS transistor which includes a gate connected to receive a second input signal;
a first p-channel metal oxide semiconductor (PMOS) transistor which includes a source connected to a source voltage, and a gate and a drain connected to a drain of the first NMOS transistor;
a second PMOS transistor which includes a source connected to the source voltage, and a drain connected to the drain of the first NMOS transistor;
a third PMOS transistor which includes a source connected to the source voltage, and a gate and a drain connected to a drain of the second NMOS transistor and to a gate of the second PMOS transistor;
a fourth PMOS transistor which includes a source connected to the source voltage, a gate connected to the gate of the first PMOS transistor, and a drain is connected to the drain of the second NMOS transistor; and
a third NMOS transistor which includes a drain connected to sources of the first and second NMOS transistors, a gate is connected to receive an enable signal, and a source connected to a ground voltage.

* * * * *